United States Patent
Trümpler et al.

(10) Patent No.: US 6,768,322 B2
(45) Date of Patent: Jul. 27, 2004

(54) DEVICE FOR MEASURING AN ELECTRICAL CURRENT THAT FLOWS THROUGH A STRIP CONDUCTOR

(75) Inventors: Walter Trümpler, Karlsruhe (DE); Horst Kohnle, Karlsruhe (DE); Reiner Hinken, Nortorf (DE)

(73) Assignee: Sauer-Danfoss Holding A/S (DK)

( * ) Notice: Subject to any disclaimer, the term of this patent is extended or adjusted under 35 U.S.C. 154(b) by 25 days.

(21) Appl. No.: 10/204,527

(22) PCT Filed: Mar. 15, 2001

(86) PCT No.: PCT/DK01/00173

§ 371 (c)(1),
(2), (4) Date: Aug. 21, 2002

(87) PCT Pub. No.: WO01/69269

PCT Pub. Date: Sep. 20, 2001

(65) Prior Publication Data

US 2003/0020453 A1 Jan. 30, 2003

(30) Foreign Application Priority Data

Mar. 17, 2000 (DE) .......................... 100 13 345

(51) Int. Cl.[7] .............................................. G01R 27/08
(52) U.S. Cl. ...................................... 324/713; 324/72.5
(58) Field of Search .............................. 324/76.11, 500, 324/512, 520, 537, 713, 750, 72.5; 361/106

(56) References Cited

U.S. PATENT DOCUMENTS 4,713,607 A * 12/1987 Pepper ...................... 324/133
4,743,847 A * 5/1988 Frushour .................... 324/537
4,937,521 A    6/1990 Yoshino et al.
6,028,426 A * 2/2000 Cameron et al. ........... 324/126
6,316,949 B1 * 11/2001 Yamashita .................. 324/683

FOREIGN PATENT DOCUMENTS

| DE | 3324224 A1 | 7/1983 |
| DE | 34 40 986 A1 | 11/1984 |
| DE | 36 26 328 A1 | 8/1986 |
| DE | 0 265 076 A1 * | 9/1987 |
| DE | 197 55 773 A1 | 12/1997 |
| DE | 198 38 974 A1 | 8/1998 |
| EP | 0 315 358 A2 | 5/1989 |
| EP | 0 408 136 B1 | 1/1994 |
| EP | 0 539 081 B1 | 3/1998 |
| EP | 0 893 696 A2 | 7/1998 |

* cited by examiner

*Primary Examiner*—Jay Patidar
*Assistant Examiner*—Walter Benson

(57) ABSTRACT

Device for measuring an electrical current (I) that flows through a strip conductor (1), with a current-less measuring conductor (3) extending in the flow direction of the current, along and in the proximity of a measuring section (2) of the strip conductor (1), one end of the measuring conductor (3) being electrically connected with one end of the measuring section (2), the other end of the measuring section being provided with a first measuring point (4), and with a second measuring point (5) being electrically connected with the other end of the measuring section (2), characterised in that the measuring section (2) is rectilinear, that the second measuring point (5) is connected directly with the measuring section (2), and a voltage (U) is taken from the measuring points (4, 5).

11 Claims, 3 Drawing Sheets

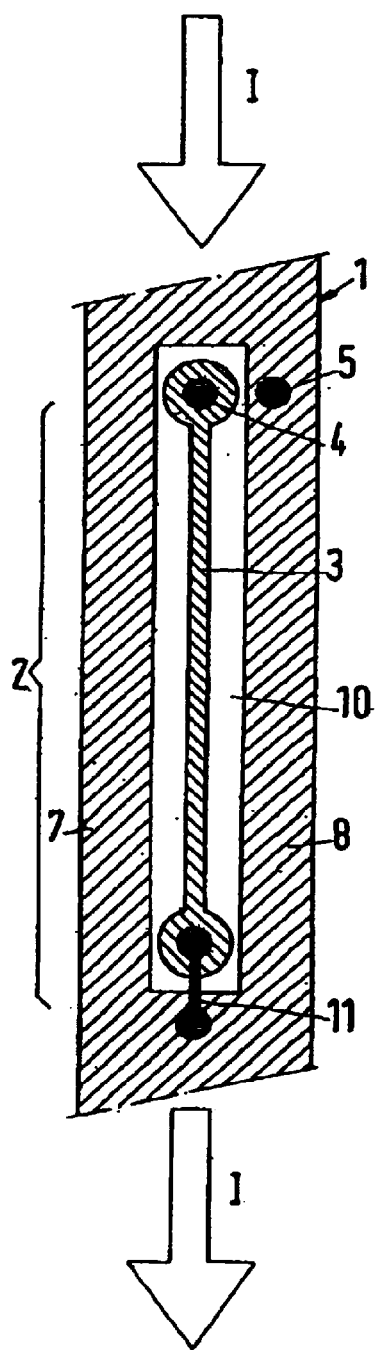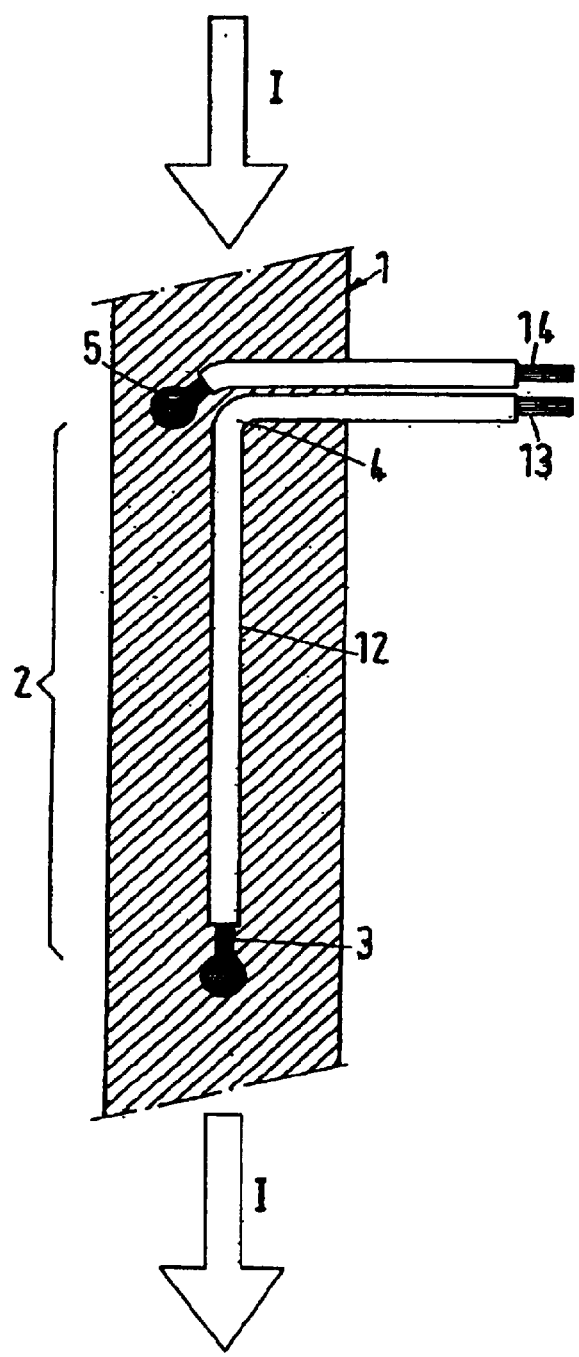

DEVICE FOR MEASURING AN ELECTRICAL CURRENT THAT FLOWS THROUGH A STRIP CONDUCTOR

CROSS REFERENCE TO RELATED APPLICATIONS

This application is the U.S. national phase application of International Application No. PCT/DK01/00173 filed Mar. 15, 2001 which claims priority of German (DE) Application No. 100 13 345.2, which are incorporated in their entirety by reference made herein.

FIELD OF THE INVENTION

The invention concerns a device for measuring an electrical current that flows through a strip conductor, with a measuring conductor extending in the current flow direction, along and in the proximity of a measuring section of the strip conductor, one end of the measuring conductor being electrically connected direct with one end of the measuring section, the other end of the measuring section being provided with a first measuring point, and with a second measuring point being electrically connected with the other end of the measuring section.

BACKGROUND OF THE INVENTION

In a known measuring device of this kind (DE 33 24 224 A1, FIG. 4), the strip conductor is bent to a U-shape, a measuring conductor being arranged on the outside of each leg of the U-shaped strip conductor, one end of each measuring conductor being electrically connected with one of the free leg ends. A strip conductor of this kind cannot be arranged on an insulating base plate, like the strip conductors of a printed circuit. Further, part of the current is branched off from the strip conductor via one of the measuring conductors and led to the other measuring conductor via a inverse feedback resistor of an operational amplifier, as well as voltage sources. The measured voltage is taken from the output of the operational amplifier, said measured voltage then being proportional to the inverse feedback resistance and the ratio of the resistance of the strip conductor as well as the sum of this resistance and the resistance of the measuring conductor. An operational amplifier can typically supply up to 10 mA. However, the current to be measured in the strip conductor can amount to 1000 A. Already with a current to be measured of 100 A, this results in a measuring conductor cross-section, which has a ratio of 10,000 to that of the strip conductor. In order to perform accurate measuring, this extreme cross-section ratio even has to be made with an accuracy of a few percent. This is practically not possible, when the strip conductor only has the usual width of a few millimetres. The cross-section of the measuring conductor would be too small and would not provide an accurately defined value, as required for an accurate measuring. Additionally, the inverse feedback resistor and additional voltage sources are expensive.

From EP 0 408 136 B1 is known an integrated circuit (IC), in which a current measuring occurs internally in the IC on a strip conductor, which has a known ohmic resistance over a known length. Via a slit, the strip conductor is divided into two partial currents, and at two measuring points on both sides of the strip conductor a voltage drop is taken as measure of the current.

SUMMARY OF THE INVENTION

The invention addresses the task of providing a measuring device as mentioned in the introduction, in which the sizes of strip conductor and measuring conductor can be selected more freely, particularly, a traditional strip conductor can be chosen, the cost of said measuring device being lower, even with a higher measuring accuracy, without causing measuring errors through inductive voltage drops at the measuring section.

This task is solved in that the measuring section is rectilinear, that the second measuring point is connected directly with the measuring section, that the measuring conductor is substantially current-less and that as measure of the current to be measured, a voltage is taken from the measuring points.

With this solution, the measuring is practically done current-less. A traditional, rectilinear strip conductor with the usual dimensions can be used. Also in the case of heavy current, the limits for the variation of the cross-section ratio of the strip conductor and the measuring conductor are wide. The costs are lower. Still, however, inductive voltage drops occurring in the measuring sections cause practically no measuring errors.

Preferably, the measuring conductor extends into the immediate proximity of the connecting spot of the measuring section and the second measuring point. Accordingly, the voltage, induced into the measuring conductor by a pulsating current flowing through the strip conductor, is higher, so that an inductive voltage drop in the measuring section is equalised very accurately.

According to the invention, the measuring conductor is arranged outside a plane defined by the strip conductor, the conductor being electronically connected to the strip conductor by an electrical connection, the device further comprising an insulating material which provides an electrical insulation between a major portion of the measuring conductor and the strip conductor.

In one embodiment, it may be ensured that the measuring conductor is arranged on an insulator fixed on the strip conductor. Via a heat conducting, electrically insulating layer, the strip conductor can, in a manner known per se, be arranged on a copper plate. With this solution, the copper plate and its heat conducting, but electrically insulating layer serves, on the one hand, as a substrate for the strip conductor and the measuring conductor as well as other electrical components and, on the other hand, also to transfer heat from the electrical components and the strip conductor. Here, eddy currents induced in the copper plate by an alternating current or a square wave current flowing in the strip conductor can also induce a voltage in the measuring conductor. As, however, in this case the measuring conductor is not in the same level as the strip conductor, but has a somewhat larger distance from the copper plate, which corresponds to the thickness of the insulator, the eddy currents merely induce a very low voltage in the measuring conductor, which hardly falsifies the measured value.

Preferably, the insulator is made of ceramic. This material has particularly good heat conducting and electrically insulating properties. At the same time, the ceramic and the material of the insulating layer applied on the copper plate can have substantially the same thermal expansion coefficient.

For fixing the insulator on the strip conductor, the bottom side of the insulator is preferably provided with a copper layer, which is brazed onto the strip conductor.

An alternative embodiment the measuring conductor could be surrounded by an insulating layer. This also gives a larger distance between the measuring conductor and a base plate of copper, on which the strip conductor is fixed by way of an electrically insulating layer.

An advantageous embodiment foresees that a temperature sensor is arranged near the strip conductor, said temperature sensor being connected with a control device of a power unit, which controls the power unit in dependence of a measured value of a load current, and communicating with a memory, that a correction factor, which corresponds to the deviation of the ohmic resistance of the measuring section from a predetermined nominal value, is stored in the memory, and that the control device multiplies each measured value of the load current flowing through the strip conductor by the correction factor. In this way, measuring errors are automatically equalised through a test measuring performed prior to the start-up by means of the known value of the current flowing through the strip conductor, in such a way that the correction factor is determined on the basis of the test measuring result and stored in the memory, from where it is downloaded by the control device during operation and used for the correction of the current measurings performed during operation.

The correction factor can compensate the dependence of the ohmic resistance of the measuring section on a manufacturing tolerance of the cross-section of the measuring section known in advance.

A second correction factor can compensate the dependence of the ohmic resistance of the measuring section on the temperature.

With a pulsating current having a ripple, the measuring value is preferably sampled during a pulse flank, preferably in its middle. Hereby, only the fundamental wave is measured and the current ripple is substantially eliminated from the measuring result.

In the following, the invention and its various embodiments are described in detail on the basis of the enclosed drawings, showing:

BRIEF DESCRIPTION OF THE DRAWINGS

FIG. 2 a section of a strip conductor with an embodiment of a measuring section.

FIG. 3 a section of a strip conductor with a second embodiment of a measuring section.

DESCRIPTION OF THE EMBODIMENTS OF THE INVENTION

Figure 1:
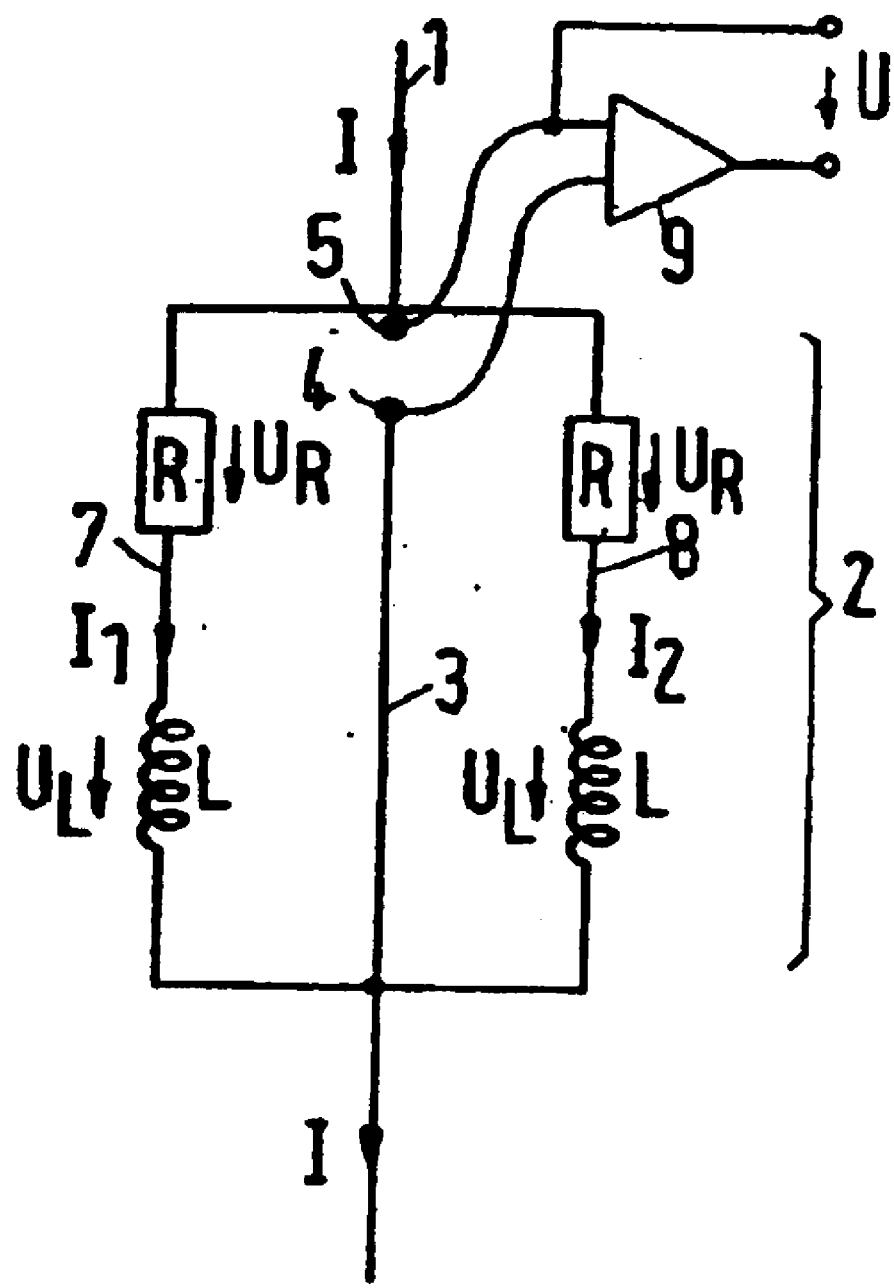
FIG. 1 an equivalent circuit diagram of a strip conductor and a measuring section for measuring a current flowing through the strip conductor by measuring a voltage at the measuring section with a connected voltage amplifier for the measured voltage.

According to FIGS. 1 and 2, an electrical current I flowing through a lengthy strip conductor 1 in an Intelligent Power Module (IPM), not shown in FIGS. 1 and 2, is measured by a measuring conductor 3 extending longitudinally in the current flow direction in the proximity of a rectilinear measuring section 2 of the strip conductor 1, the measuring conductor 3 being electrically insulated on both sides in relation to the measuring section 2. The measuring conductor 3 is arranged in a level, which is perpendicular to the level of the measuring section 2, placed substantially in the longitudinal centre of the measuring section 2, symmetrically to said perpendicular level. One end of the measuring conductor 3 is electrically connected directly with one end of the measuring section 2. The other end of the measuring conductor 3 is provided with a first measuring point 4. The end of the measuring conductor 3 provided with the first measuring point 4 is also connected with the strip conductor 1 via the measuring conductor 3. A second measuring point 5 is electrically connected directly with the other end of the measuring section 2. In the current flow direction, this other end of the measuring section 2 lies before the first mentioned one end of the measuring section 2. However, the direction of the current I can also be the opposite of, what is shown. At the measuring points 4, 5, a voltage U is collected via a measuring amplifier 9 (FIG. 1) as a measure of the current to be measured, the measuring conductor 3 being substantially current-less.

The measuring conductor 3 extends into the immediate proximity of the connecting spot of the measuring section 2 and the second measuring point 5. The measuring points 4, 5 must not necessarily be arranged side by side in relation to the current flow direction. On the contrary, they can also be arranged in series in the current flow direction.

This ensures that the sides of the measuring conductor 3 are electrically insulated in relation to the strip conductor 1 or the strip conductor sections 7 and 8, respectively, and thus only electrically connected with the strip conductor with its one end via a conductor 11. The current I flowing through the strip conductor 1 can amount to up to 1000 A.

As shown in FIG. 1, the strip conductor sections 7 and 8 have equally large ohmic resistors R and provide equally large inductivities L, amounting to a total of approximately 10 to 20 nH towards high-frequency currents I, for example, sine-shaped alternating currents or pulse-like currents with steep flanks, particularly square pulses.

If the current I is a direct current, the partial currents $I_1$ and $I_2$ are also direct currents, which are equal to each other and to half of the current I. The partial currents $I_1$ and $I_2$ then only generate a voltage drop UR at the ohmic resistors R, which is proportional to the current I and is collected in the shape of a measured voltage U as a measure of the current I via the amplifier 9 (having a high-ohmic input resistance in relation to the resistors R).

In the case of a high-frequency, sine-shaped alternating current I or a pulsating current I with steep flanks, however, a voltage drop $U_L$ occurs over the inductivities L of the strip conductor sections 7 and 8. These inductive voltage drops $U_L$ would falsify the measuring result, if the measured voltage were collected immediately at both ends of the measuring section 2. In the present case, however, the measured voltage is collected at the free end of the measuring conductor 3 and at the front end (current upstream) in the direction of the current I of the measuring section 2 between the measuring points 4, 5. Thus, a measuring error caused by the inductive voltage drops $U_L$ at the inductivities is avoided, as the magnetic fields of the partial currents $I_1$ and $I_2$ are linked or transform, respectively, with the measuring conductor 3, also inducing voltages in the measuring conductor 3, whose sum is approximately equal to one of the inductive voltage drops $U_L$ at the inductivities L. Further, the voltages induced in the measuring conductor are directed against the inductive voltage drops $U_L$ in the loops 3, 7, 5 or 3, 8, 5, respectively, so that they substantially equalise the voltage drops $U_L$, meaning that also with a current I that changes rapidly over the time, only the voltage drop UR is measured as a measure of the current I, while practically no current is flowing through the measuring conductor 3.

Via an electrically insulating layer, the strip conductor 1, being part of a power module, is arranged on a carrier in the form of a copper plate, on which also the remaining components of the power module are arranged, the electrically insulating layer being, like the copper plate, a good heat conductor, in order that the dissipated heat of the components, including a possible dissipated heat of the strip conductor 1, can be transferred away. Therefore, the electrically insulating layer is preferably made of ceramic, which is also a good heat conductor. The strip conductor is fixed on the copper plate by means of the DCB process (DCB=Direct Copper Bonding).

In the embodiment according to FIG. 2, an electrically insulating, yet heat-conductive insulator 10 is arranged in the longitudinal centre of the strip conductor 1 in the shape of a bar, the bottom side of the insulator 10 being provided with a copper layer, with which it is brazed onto the strip conductor 1. On the topside of the insulator 10, which is again made of ceramic, the measuring conductor 3 is arranged, preferably also by means of the DCB process. In this case the conductor 3 is not made in one piece with the strip conductor 1, but is connected with one end of the measuring section 2 by means of the conductor 11. The measuring points 4 and 5 are again arranged near the upstream front end of the measuring section 2. Also in this embodiment the strip conductor 1 is arranged, by means of a heat-conductive, electrically insulating layer, preferably of ceramic by means of the DCB process, on a copper plate, meant for carrying off heat.

This embodiment has the advantage that, due to the inserted insulator 10, the measuring conductor 3 has a somewhat larger distance from the copper plate forming the carrier, so that the magnetic field generated by eddy currents, which are induced in the copper plate forming the carrier by a large alternating current or pulsating current I, induces a lower voltage in the measuring conductor 3, which would influence the compensating voltage induced in the measuring conductor 3 by the current I, particularly in that the flank steepness of the current I would decrease and it would take a too long time for the voltage to be measured to get stable enough to allow a correct measuring. The larger distance of the measuring conductor 3 from the copper plate substantially eliminates the influence on the voltage in the measuring conductor 3 by the eddy currents. Still, the distance of the measuring conductor 3 from the strip conductor 1 is chosen sufficiently small to permit the induction of a compensating voltage in the measuring conductor 3.

In principle, the embodiment according to FIG. 3 differs from that in FIG. 3 merely in that the measuring conductor 3 is not arranged on a bar-shaped insulator, but is completely surrounded by an insulating layer 12, which, however, serves the same purpose as the insulator 10 in FIG. 3 and is fixed on the strip conductor 1. In this case, the measuring conductor according to FIG. 3 can be a cross-sectionally circular wire, as opposed to the flat measuring conductors 3 in the preceding embodiments. Connecting conductors 13 and 14 with the measuring points 4 and 5 extend approximately at right angles to the longitudinal direction of the strip conductor 1, in order to avoid that a changing current I causes the induction into said connecting conductors 13 and 14 of voltages falsifying the measured voltage.

Also in the remaining embodiments according to the FIGS. 1 and 2 such connecting conductors, like the connecting conductors 13 and 14 in FIG. 3, should extend substantially at right angles to the longitudinal direction of the strip conductor 1.

Figure 4:
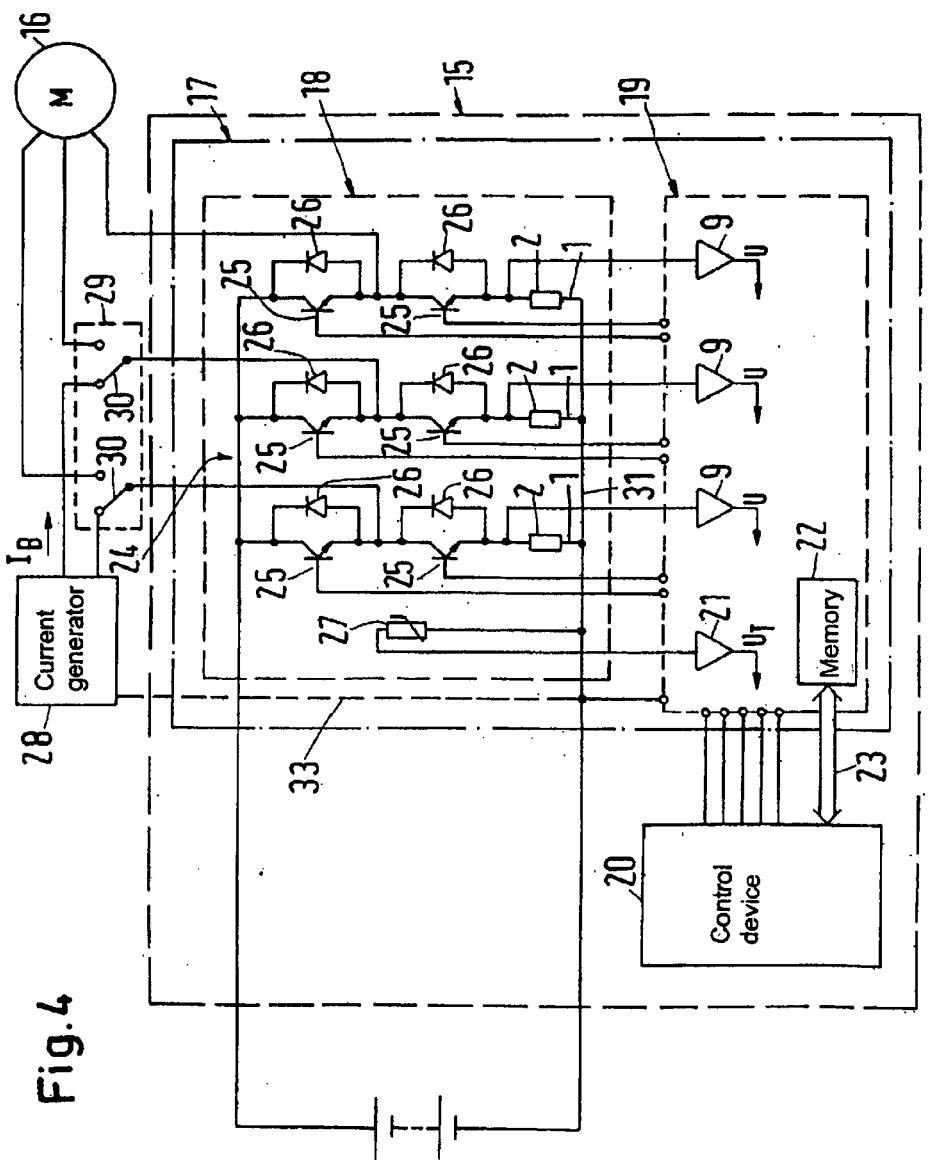
FIG. 4 a block diagram of a control device for a load in the form of a squirrel-cage motor with an "intelligent" power module, in which currents in the strip conductors can be measured in accordance with one of the embodiments in the FIGS. 1 to 3.

In the shape of a schematic block circuit diagram, FIG. 4 shows a control device 15 for a load 16, driven by a three-phase alternating current, which control device 15 comprises an "intelligent" power module 17, also called IPM.

The power module 17 comprises a power unit 18 and a control and measuring unit 19. The power module 17 is connected with a control device 20 by way of individual conductors and connections, the control device 20 comprising a microprocessor (not shown). The control and measuring unit 19 comprises measuring amplifiers 9 and 21 and, not shown, drivers for the power unit 18, which drivers are also connected with the control device 20 by way of individual conductors, as well as a memory 22, here an EEPROM, which is in communicating connection with the control device 20 via a data bus 23. Alternatively to the embodiment shown, the control device 20 can also be arranged in the control and measuring unit 19 and thus in the power module 17.

Via an electrically insulating, yet heat-conducting layer, preferably made of ceramic, the power unit 18 is fixed on a carrier in the form of a copper plate, meant for carrying off heat.

The power unit 18 comprises a current converter 24 with power switching elements 25 in the form of transistors and with free-running diodes 26 for controlling the operation of the load 16, here an asynchronous motor. The power unit 18 further comprises, in each supply conductor carrying the current of the power unit 18 and thus also the current for the load 16, a measuring section 2, according to one of the embodiments in FIGS. 1 to 3, in the form of a strip conductor 1 in each of the three phases of the current converter 24, here an inverter. Each measuring section 2 is connected with the control device 20 via one of the measuring amplifiers 9, giving the voltage drop of the measuring section. Further, the power unit 18 comprises a temperature sensor 27, here a temperature-dependent resistor, which measured the temperature of the copper plate and thus also that of each strip conductor 1, and whose measured values are also transmitted to the control device 20 in the form of a measured voltage UT. Instead of several measuring sections 2, each arranged in a strip conductor 1, also only one measuring section 2 can be provided, which is arranged in a common supply line of the current converter 24 or of a one-phase load. In both cases, the or each, respectively, measuring section 2 determines a measure of the load current flowing through at least one supply conductor.

A current generator 28 and a switch 29 are arranged outside, as shown, or inside the control device 15. The current generator 28 generates a current $I_B$ with a predetermined power. The switch 29 has two movable contacts 30, whose roots are connected with one of the two-phase outputs, that is, the connecting spots of two series-connected power switching elements 25.

The current generator 28 and the switch 29 serve the purpose of correcting errors when measuring the measuring voltage U, which is a measure of the current in the measuring section during operation, U being amplified by the amplifier 9. Such measuring errors may occur in that the ohmic resistance of the measuring section 2 of the strip conductor 1 concerned can be different due to the manufacturing tolerances, that is, different width, thickness and length of the measuring path, and because of the temperature coefficient of the resistance of the material of the strip conductor 1 during changing temperatures of the measuring section 2, as well as offset errors in the amplification circuit.

In order to compensate such measuring errors, the current generator 28 is connected to a power module with gauged measuring sections 2. At the same time, the switching elements 25, connected with the return conductor 31 and the contacts 30 via the measuring sections 2, are turned on, that is, closed, by means of the control device 20, in order that the known current $I_B$ of the current generator 28 flows back to the current generator 28 via one of the contacts 30, the series-connected switching element 25, the measuring sections 2 connected in series with the switching element 25, the return conductor 31, a further measuring section 2, the diode 26 connected in series with the measuring section 2, and the other contact 30. The voltages measured by this gauging, and the temperature measured simultaneously by the temperature sensor 27 are stored in the memory of the microprocessor of the control device 20. Before starting any further power module 17 of a series, the current generator 28 is then connected to the power module 17. Thus, the values of the measured voltages U and the temperature measured simultaneously by the temperature sensor 27 are transmitted to the memory of the microprocessor of the control device 20. Based on a comparison of the gauging values with the measured values of the new power module 17, a correction factor $K_H$ is then calculated by the microprocessor of the control device 20, which considers the deviation of the gauging values from the measured values of the new power module 17. This correction factor $K_H$ is transmitted from the control device 20 to the memory 22. Similarly, a temperature correction factor $K_T$ considering the temperature dependence of the measuring sections 2, which was previously determined and stored in the memory of the microprocessor of the control device 20, is transmitted to the memory 22. Preferably, however, the temperature correction factor is determined currently during operation and stored in the memory 22. During operation, the measured current value U is multiplied by the correction factors $K_H$ and $K_T$, following the download of the correction factors from the memory 22 in the control device 20. The current generator 28 and the switch 29 can also be incorporated in the control device 15. In order to compensate a possible offset voltage of the measuring amplifier 9, this voltage can be measured repeatedly during operation breaks and be used for correction during operation.

The corrected measured voltages U are then independent of temperature changes and manufacturing tolerances of the measuring sections 2, and are used for controlling the current converter 24 through the control device 20 via the control and measuring unit 19.

Additionally, the corrected measured current value is taken from the power module 17 and, if required, displayed on a display device.

In stead of leading the known current $I_B$ by means of the two-pole switch 29 via a current circuit, which comprises two switching elements 25 and two measuring sections 2, it is also possible to use a current generator 28 with only one output and a return conductor 33 connected with the common return conductor 31 of all current converter branches, as well as a switch, which, during gauging or error correction, respectively, connects the output of the current generator 28 with all outputs of the current converter 24. The switching elements 25 connected direct with the measuring sections 2 can then be turned on consecutively by means of the control device 20. During operation, after an error correction, the switch would then separate the current generator 28 from the current converter 24 and connect the load 16.

If, in the usual manner, the power is controlled by a pulse width modulation via the current converter 24, the pulsating current has a large ripple. Expediently, the sampling of the measuring value by means of the control device 20 therefore occurs already during the rising flank of the current, preferably in its middle. Thus, only the fundamental wave is measured and the current ripple is blanked from the measured result.

Further to memory sections for the measured values of temperature and current as well as for the correction factors, the memory 22 can comprise additional memory sections for characteristic data, as stated on data plates, manufacturing data, like lot number, component data, driving parameters, operating incidents, like data of extreme load situations and malfunction data, like defects. During manufacturing this has the advantage that the same memory 22 can be used with different power parts. Further, for repair purposes, a "log book" of repair processes and limit value excesses can be stored. In order to increase the operating reliability of the module, operating parameters, which are usually stored in the memory of the control device 20, are additionally stored in the memory 22. Thus, when replacing the control device 20, the new control device can download the old operating parameters from the memory 22.

What is claimed is:

1. Device for measuring an electrical current that flows through a strip conductor which defines a plane, with an essentially current-less measuring conductor extending in the flow direction of the current, along and in the proximity of a rectilinear measuring section of the strip conductor, one end of the measuring conductor being electrically connected with one end of the measuring section, the other end of the measuring section being provided with a first measuring point, and with a second measuring point being electrically connected with the other end of the measuring section, the second measuring point being connected directly with the measuring section, so that as measure of the current to be measured, a voltage is taken from the measuring points, the measuring conductor being arranged outside said plane of the strip conductor, the conductor being electrically connected to the strip conductor by an electrical connection, the device further comprising an insulating material which provides an electrical insulation between a major portion of the measuring conductor and the strip conductor.

2. Device according to claim 1, characterised in that the measuring conductor extends into the immediate proximity of the connecting spot of the measuring section and the second measuring point.

3. Device according to claim 1, characterised in that the measuring conductor is arranged on an insulator fixed on the strip conductor.

4. Device according to claim 3, characterised in that the insulator is made of ceramic.

5. Device according to claim 3, characterised in that a copper layer on the bottom side of the insulator is brazed onto the strip conductor.

6. Device according to claim 1, characterised in that the measuring conductor is surrounded by an insulating layer.

7. Device according to claim 1, characterised in that a temperature sensor is arranged near the strip conductor, said temperature sensor being connected with a control device of a power unit, which controls the power unit in dependence of a measured value of a load current, and communicating with a memory, that a correction factor, which corresponds to the deviation of the ohmic resistance of the measuring section from a predetermined nominal value, is stored in the memory, and that the control device multiplies each measured value of the load current flowing through the strip conductor by the correction factor.

8. Device according to claim 7, characterised in that the correction factor compensates the dependence of the ohmic resistance of the measuring section on a manufacturing tolerance of the cross-section of the measuring section, the manufacturing tolerance being known in advance.

9. Device according to claim 7, characterised in that a second correction factor compensates the dependence of the ohmic resistance of the measuring section of the temperature.

10. Device according to claim 1, characterised in that with a pulsating current having a ripple, the measuring value is sampled during the middle of a pulse flank.

11. The use of the device according to claim 1 in a power module.

* * * * *